United States Patent
Kamono

(10) Patent No.: US 7,755,877 B2
(45) Date of Patent: Jul. 13, 2010

(54) CONVEYING METHOD, CONVEYANCE APPARATUS, EXPOSURE APPARATUS, AND DEVICE MANUFACTURING METHOD

(75) Inventor: Takashi Kamono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 738 days.

(21) Appl. No.: 11/147,224

(22) Filed: Jun. 8, 2005

(65) Prior Publication Data

US 2005/0275998 A1    Dec. 15, 2005

(30) Foreign Application Priority Data

Jun. 14, 2004    (JP) .............................. 2004-175604

(51) Int. Cl.
*H01L 21/683* (2006.01)
(52) U.S. Cl. ..................................... 361/234
(58) Field of Classification Search .................. 361/234
See application file for complete search history.

(56) References Cited

U.S. PATENT DOCUMENTS

| | | | |
|---|---|---|---|
| 5,498,118 A | 3/1996 | Nakahara | 414/416 |
| 5,872,694 A * | 2/1999 | Hoinkis et al. | 361/234 |
| 6,048,655 A | 4/2000 | Nakahara | 430/22 |
| 6,473,157 B2 * | 10/2002 | Nakahara | 355/53 |
| 6,778,377 B2 * | 8/2004 | Hagi | 361/234 |
| 2001/0033369 A1 * | 10/2001 | Matsui | 355/53 |
| 2002/0008954 A1 * | 1/2002 | Leeser | 361/234 |
| 2002/0086546 A1 | 7/2002 | Yamashita et al. | 438/710 |
| 2003/0072122 A1 * | 4/2003 | Ishida | 361/234 |
| 2005/0128462 A1 * | 6/2005 | Matsui | 355/72 |

FOREIGN PATENT DOCUMENTS

| | | |
|---|---|---|
| JP | 5-278813 | 10/1993 |
| JP | 2000-31252 | 1/2000 |
| JP | 2001-315085 | 11/2001 |
| JP | 2002-203837 | 7/2002 |
| JP | 2002-2252275 A * | 9/2002 |

* cited by examiner

*Primary Examiner*—Jared J Fureman
*Assistant Examiner*—Nicholas Ieva
(74) *Attorney, Agent, or Firm*—Fitzpatrick, Cella, Harper & Scinto

(57) ABSTRACT

A method of holding an object with an electrostatic chuck and conveying the held object includes steps of measuring a property of the object concerning an electrostatic attraction force generated between the object and the electrostatic chuck; and controlling a characteristic of conveyance of the object based on a measurement result in the measuring step.

15 Claims, 7 Drawing Sheets

CONVEYING METHOD, CONVEYANCE APPARATUS, EXPOSURE APPARATUS, AND DEVICE MANUFACTURING METHOD

BACKGROUND OF THE INVENTION

1. Field of the Invention

The present invention relates to a technique for holding a substrate with a dielectric chuck and conveying the held substrate.

2. Description of the Related Art

For a semiconductor manufacturing process, a projection EUV exposure system is proposed in that a reticle pattern is projected and transcribed on a silicon wafer using EUV (extreme ultraviolet) light with a wavelength of 13 to 14 nm as light exposure.

The disclosed EUV exposure system will be described with reference to FIG. 8. A reticle 306A has a device pattern drawn thereon. A vacuum chamber 303 forms a vacuum region. The reticle 306A is mounted on a reticle stage 306. A reticle lock 320 is used when the reticle 306A is conveyed into the vacuum chamber 303. A reticle changer hand 313 is used for conveying the reticle 306A. A reticle stocker 312 is for storing the reticle 306A within the vacuum region.

In such a conventional exposure system, the reticle 306A passed through the load lock 320 is conveyed to the reticle stocker 312 in the vacuum region with the reticle changer hand 313. Furthermore, the reticle changer hand 313 conveys the reticle 306A in the reticle stocker 312 to the reticle stage 306 so as to expose the reticle 306A with light.

As for conveying a reticle within an exposure system, a unit for vacuum attracting the bottom surface of a reticle is disclosed in Japanese Patent Laid-Open No. 05-278813. As for conveying a reticle in the vacuum region, a hand for electrostatically attracting the reticle is disclosed in Japanese Patent Laid-Open No. 2001-315085, No. 2000-031252, and No. 2002-203837.

However, in the above-mentioned conveying units, there has been a problem that an original plate (reticle) drops and is damaged during conveying. That is, under a vacuum condition as in the EUV exposure system, even when the reticle bottom surface is vacuum-suctioned as disclosed in Japanese Patent Laid-Open No. 05-278813, the pressure difference is small so that sufficient adsorption power for conveying the reticle cannot be obtained. The reticle used in the EUV exposure system is generally made of glass, so that by the electrostatic chuck as disclosed Japanese Patent Laid-Open No. 2001-315085, No. 2000-031252, and No. 2002-203837, sufficient adsorption power for conveying the reticle cannot be obtained. Furthermore, since a conductive film as a pattern film is formed on the bottom surface of the reticle used for the EUV exposure system, although the conductive film can be chucked with the electrostatic chuck, the adsorption power is different depending on the film material and the film quality, so that the reticle may drop and be damaged during conveying.

SUMMARY OF THE INVENTION

The present invention has been made in view of the situations mentioned above, and can provide a reliable substrate conveyance technique.

A method of holding an object with an electrostatic chuck and conveying the held object according to an aspect of the present invention includes steps of measuring a property of the object concerning an electrostatic attraction force generated between the object and the electrostatic chuck; and controlling a characteristic of conveyance of the object based on a measurement result in the measuring step.

A conveyance apparatus for conveying an object according to another aspect of the present invention includes an electrostatic chuck to hold the object; a supporting member to support said electrostatic chuck; a measuring system to measure a property of the object concerning an electrostatic attraction force generated between the object and said electrostatic chuck; and a control system to control a characteristic of conveyance of the object based on a measurement result by said measuring system.

According to the present invention, a reliable substrate conveyance technique can be provided.

Other objects and advantages besides those discussed above shall be apparent to those skilled in the art from the description of preferred embodiments of the invention which follow. In the description, reference is made to accompanying drawings, which form a part thereof, and which illustrate examples of the invention. Such examples, however, are not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

The present invention is incorporated in known conveyance mechanisms for holding and conveying a thin-plate workpiece, such as a mask, a reticle, a semiconductor wafer, and a glass substrate, for use in a semiconductor manufacturing apparatus and a semiconductor inspection apparatus. Embodiments incorporated in a reticle or a wafer of the present invention will be described below.

First Embodiment

Figure 1:
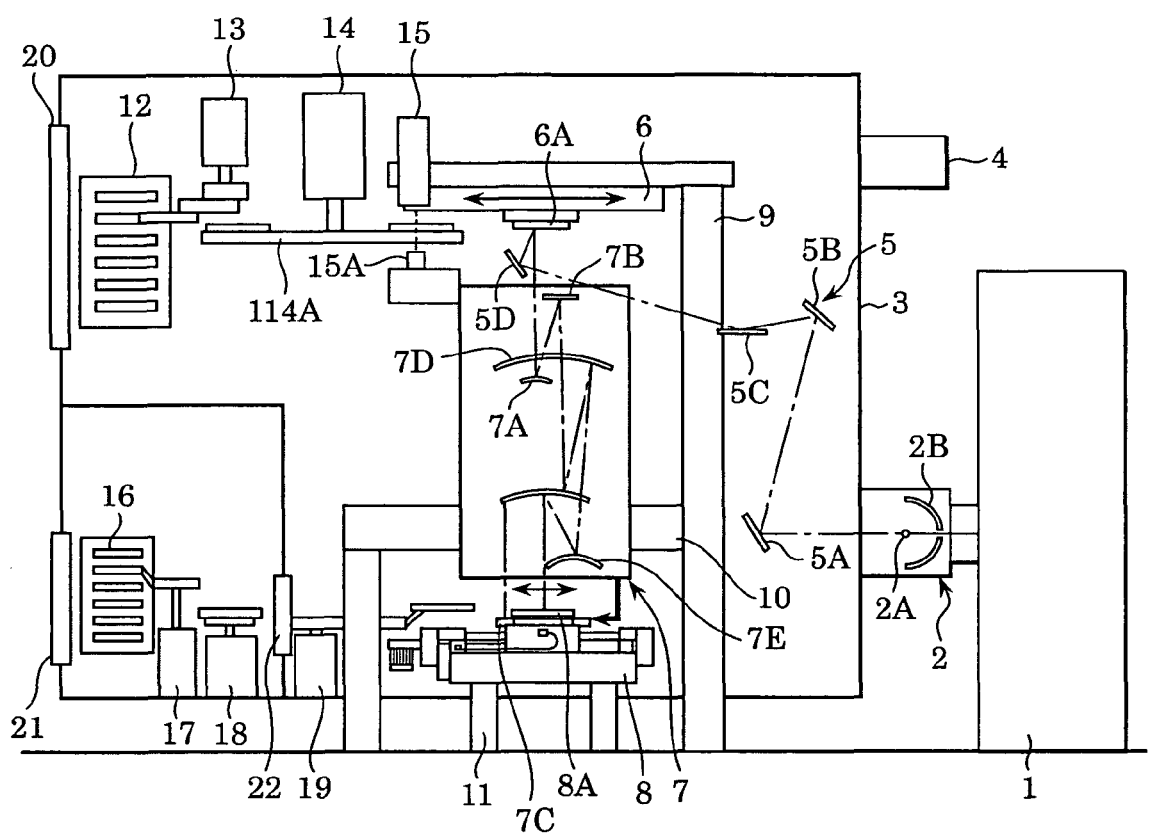
FIG. 1 is a drawing of the structure of an exposure apparatus according to a first embodiment of the present invention.

FIG. 1 is a schematic view of an exposure system having a reticle conveying hand under vacuum according to a first embodiment of the present invention. Referring to FIG. 1, a pumping laser 1 irradiates with laser a luminescent point of a light source where a light source material is evaporated, condensed, or atomized so as to make the light source material atoms radiate by plasma-exciting them. The pumping laser 1 uses a YAG (yttrium aluminum garnet) solid laser, for example.

A luminescent light source unit 2 for exposure has a structure maintained in vacuum inside, and numeral 2A denotes a luminescent point of the exposure light source (referred to as a light source below). A light source mirror 2B is arranged in a semicircular shape about the light source 2A for aligning spherical light from the light source 2A so as to condense and reflect it. To the light source 2A, a luminescent chemical element, such as liquefied Xe, atomized liquefied Xe, and Xe gas, is ejected from a nozzle (not shown) while light from the pumping laser 1 is irradiated.

A vacuum chamber 3 accommodates the entire exposure system, and can maintain a vacuum condition by a vacuum pump 4. An exposure light entry site 5 is for leading the exposure light from the luminescent light source unit 2, and is composed of mirrors 5A to 5D so as to homogenize and shape the exposure light.

On a moving part of a reticle stage 6, a reflection original plate 6A, which is a reflection original plate of an exposure pattern, is mounted. A mirror optical system 7 projects the pattern of the original plate 6A so as to reduce it. That is, the light reflected from the original plate 6A is sequentially reflected by mirrors 7A to 7E so as to finally form the pattern of the original plate on a wafer 8A at a predetermined demagnification factor. The wafer 8A, which is a Si substrate having the pattern on the original plate 6A projected under demagnification, is mounted on a wafer stage 8 and positioned at a predetermined exposure position. The wafer stage 8 is controlled to move therefor with six degrees of freedom, which are translations in X, Y, and Z directions, tilts about the X and Y axes, and a rotation about the Z axis.

A reticle stage support 9 supports the reticle stage 6 on an installation floor. A projection system support 10 supports the reduced projection mirror optical system 7 on the installation floor. A wafer stage support 11 supports the wafer stage 8 on the installation floor. Control units for measuring to control the relative position (not shown) are provided between the reticle stage 6 and the reduced projection mirror optical system 7 and between the wafer stage 8 and the reduced projection mirror optical system 7, which are independently supported by the reticle stage support 9, the projection system support 10, and the wafer stage support 11, respectively, so as to continuously maintain predetermined relative positions.

The reticle stage support 9, the projection system support 10, and the wafer stage support 11 are provided with a mount (not shown) for isolating from the vibration of the installation floor, respectively.

A reticle stocker 12 is for housing the original plate 6A (reticle) once conveyed within the system from outside, and the reticles enclosed in containers for each different pattern and each different exposure condition are accommodated therein. A reticle changer 13 selects the reticle to be used from the reticle stocker 12 and conveys it. A reticle alignment unit 14 includes a reticle alignment hand which can be moved in the X, Y, and Z directions and is rotatable about the Z axis. The original plate 6A received from the reticle changer 13 therein is rotated by 180° and conveyed to part of a reticle alignment scope 15 provided at the end of the reticle stage 6 so as to slightly move in the X, Y, and Z directions for alignment relative to an alignment mark 15A provided based on the reduced projection mirror optical system 7. The aligned original plate 6A is chucked on the reticle stage 6.

A wafer stocker 16 is for storing the wafer 8A conveyed within the system from outside, and a plurality of the wafers are accommodated therein. A wafer conveying robot 17 selects the wafer 8A to be exposed from the wafer stocker 16 so as to convey it to a wafer mechanical pre-alignment air conditioner 18. In the wafer mechanical pre-alignment air conditioner 18, the rotational position of the wafer is roughly adjusted while the wafer temperature is matched with that of the inside of the air-conditioned exposure system. A wafer feed hand 19 feeds the wafer 8A aligned and air-conditioned in the wafer mechanical pre-alignment air conditioner 18 to the wafer stage 8.

Gate valves 20 and 21 have gate closing mechanisms for use during conveying the reticle and wafer from the outside. Also, a gate valve 22 opens and closes only when the wafer 8A is conveyed through a barrier between the spaces of the wafer stocker 16 and the wafer mechanical pre-alignment air conditioner 18 and the exposure space. In such a manner, by separating the interior of the system with the barrier, the air volume once vented to the atmosphere when the wafer 8A is conveyed to and from the outside is minimized, enabling the rapid return to the vacuum equilibrium condition.

When an original plate (reticle) 6A is to be positioned and clamped, the original plate (reticle) 6A stored in the reticle stocker 12 is selected and conveyed by the reticle changer 13; further it is passed to a reticle alignment hand 114A of the reticle alignment unit 14 so as to be rotated while the reticle stage 6 is moved to a reticle alignment position by the reticle alignment scope 15.

The original plate (reticle) 6A clamped on the reticle stage 6 in position is moved to the exposure position by driving the reticle stage 6 so that a circuit pattern patterned on the original plate (reticle) 6A is focused on the wafer 8A via the reduced projection mirror optical system 7.

Figure 2:
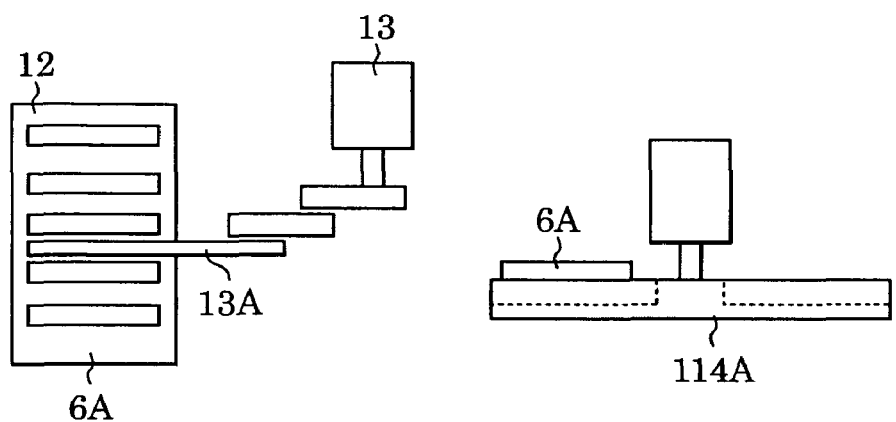
FIG. 2 is a drawing of the structure of a reticle changer according to the first embodiment of the present invention.

FIG. 2 is a schematic view of the reticle changer 13. The reticle changer 13 holds the reticle 6A stored in the reticle stocker 12 with a reticle changer hand 13A so as to convey it to the reticle alignment hand 114A. The reticle alignment hand 114A is provided with a groove for avoiding the interference with the reticle changer hand 13A, and the passing is performed in a state that the reticle 6A is held from below.

Figure 3:
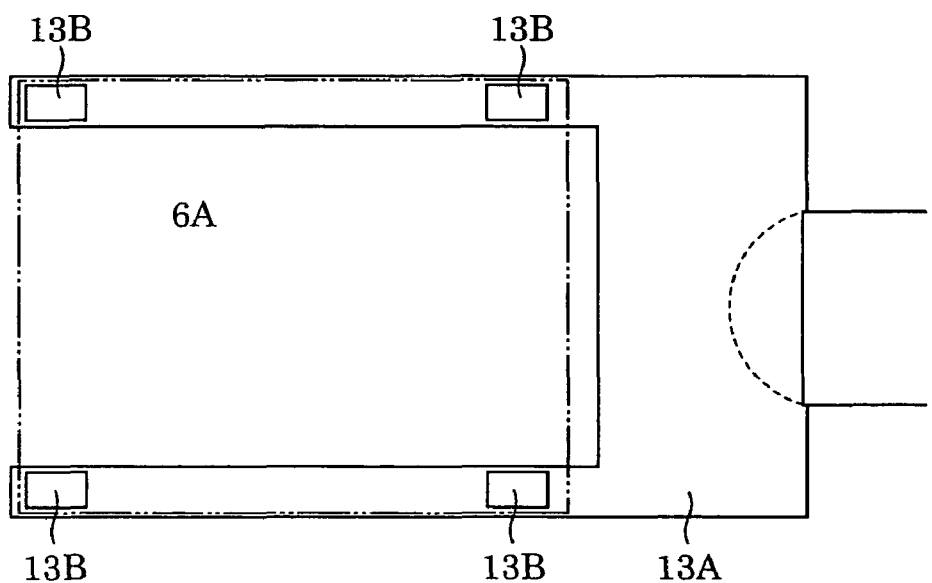
FIG. 3 is a drawing of the structure of a reticle changer hand according to the first embodiment of the present invention.

FIG. 3 is a schematic view of the reticle changer hand 13A. The reticle changer hand 13A is provided with electrostatic chuck pads 13B for holding the reticle 6A at its four corners so as to avoid the exposure region on the reticle pattern.

Figure 4A:
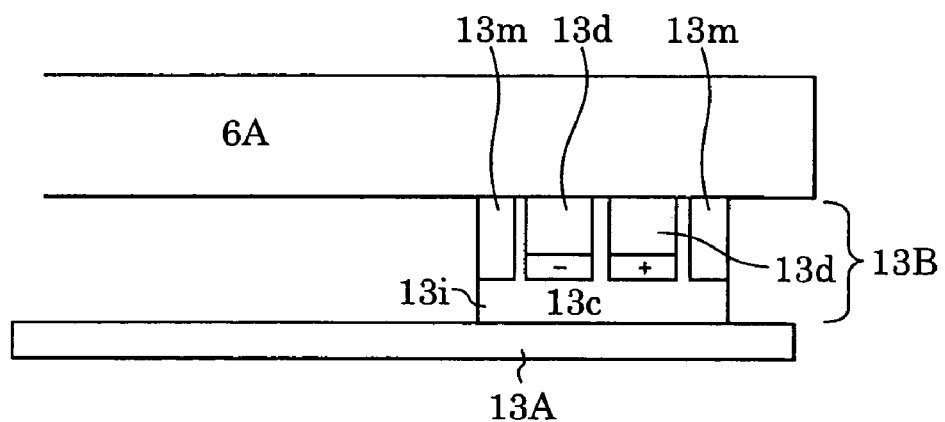
FIG. 4A is a structural drawing of the electrostatic chuck pad shown in FIG. 3.

FIG. 4A is a schematic view of the electrostatic chuck pad 13B laterally viewed in one location. The electrostatic chuck pad 13B is composed of an insulator 13$i$, positive and negative electrodes, a dielectric body 13$d$, and a measuring electrode. An electrostatic chuck 13$c$ applies a high voltage via a dielectric substance between an object to be held, such as the reticle 6A, and the electrode so as to attract the object to the electrode using an electrostatic attraction force produced between the object and the electrode.

When a DC high voltage is applied to the positive and negative electrodes by a power supply and wiring (not shown), dielectric polarization and charge distribution σ with polarity opposite to that of the voltage applied on the electrode surface of the dielectric body 13$d$ are generated inside the dielectric body 13$d$. Following this, on the opposite surface of the dielectric body 13$d$, charge distribution −σ with the same capacity and the opposite polarity is generated, and on the surface of the reticle 6A, the charge distribution σ is generated. At this time, by the charge distribution generated on the dielectric body 13$d$ and the reticle 6A, an electrostatic attraction force (Johnsen-Rahbek effect) is generated so that the object is held by the electrostatic chuck 13$c$.

Figure 4B:
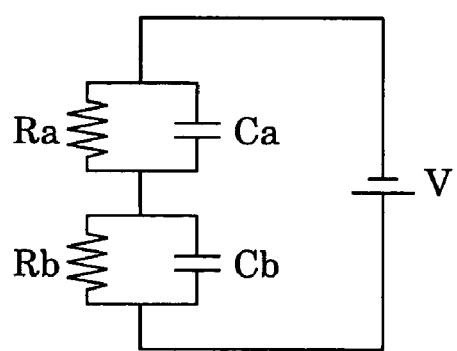
FIG. 4B is an equivalent circuit diagram of the electrostatic chuck pad.

FIG. 4B is an equivalent circuit diagram of the electrostatic chuck. In the drawing, V denotes a voltage applied between the electrode and the object; Ca and Ra denote a capacitance value and a resistance between the object and the dielectric body, respectively; and Cb and Rb denote a capacitance value and a resistance between the dielectric body and the electrode, respectively. The capacitance value Cb and the resistance Rb are uniquely defined by the electrostatic chuck device. However, the capacitance value Ca and the resistance Ra are changed dependently on the presence, the material, the thickness, and the quality of a conductive film evaporated on the reticle, so that the chucking force is also changed by those conditions. If the chucking force is small, the reticle may drop and be damaged during conveyance.

Figure 5:
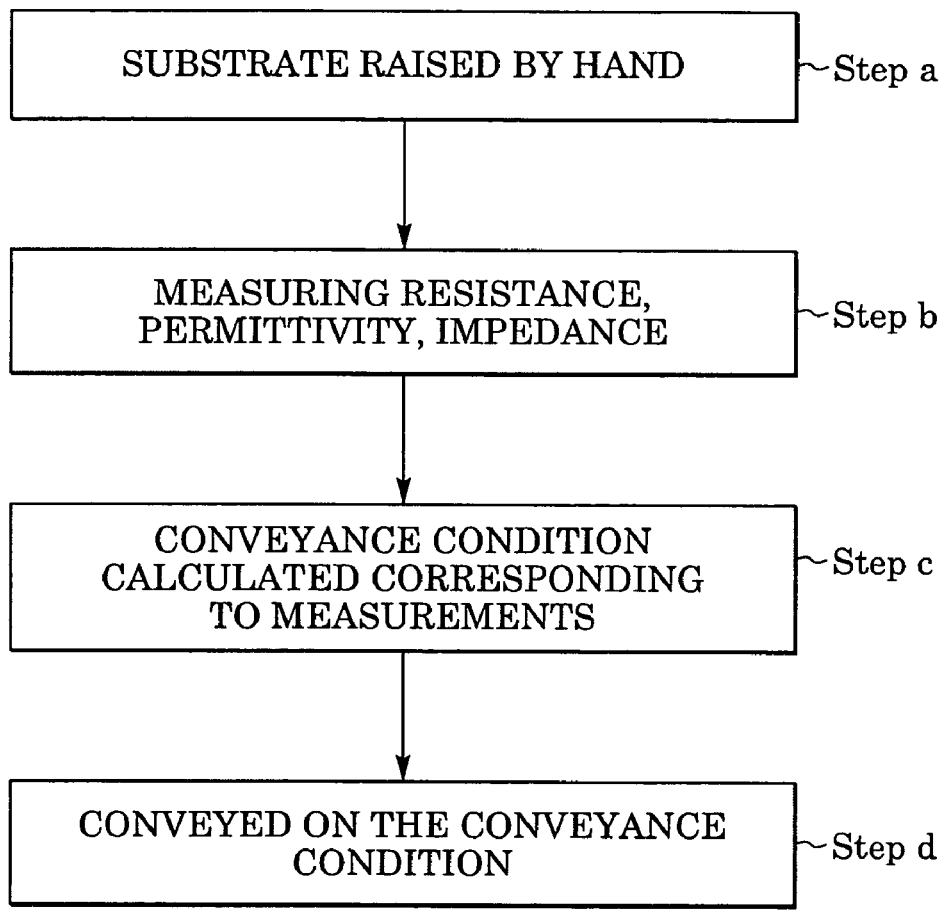
FIG. 5 is a drawing showing a sequence when conveyance is started.

According to the present invention, in order to avoid the problems described above, there is provided a measuring electrode for measuring characteristics of a surface to be chucked in advance of the reticle conveyance. FIG. 5 shows a sequence when the conveyance is started. When the reticle is vertically raised with the hand at Step a, the measuring electrode comes in contact with the surface to be chucked at Step b, so that at least one of a resistance, a dielectric constant, and an impedance of the surface to be chucked can be measured. At Step c, the conveyance condition is calculated by a controller (not shown) from the measured value obtained correspondingly thereto; then at Step d, the conveyance is started under the above-mentioned conveyance condition. The above-mentioned conveyance condition means any one of the conveying velocity, the conveying acceleration, and the feed voltage to the electrostatic chuck, or the combination of all the conditions, and the controller determines the condition including the advisability of the conveyance. For example, even in an improper operation, such as cases where the reticle having no conductive film evaporated on the surface to be chucked is incorrectly conveyed to the exposure system or where the reticle is conveyed upside down, or when a problem occurs, such as when the conductive film of the surface to be chucked is peeled off, the problem that the reticle is dropped during the conveyance due to a small attraction force can be prevented in advance, thereby achieving reliable conveyance.

In the relationship between the resistance, the dielectric constant, or the impedance of the surface to be chucked and the attraction force of the reticle, by preparing reticles having conductive films with different characteristics in advance, the reticle peeling and the reticle displacement due to a lateral force are measured and stored in the controller as a table. Hence, by measuring the characteristics of the surface to be chucked in advance of the reticle conveyance, the reticle can be conveyed with an optimum conveying profile. The optimum conveying profile herein means an arbitrary combination of conveyance sequences including the conveying speed, the conveying acceleration, and the voltage supplied to the electrostatic chuck.

According to the embodiment, a measuring unit for measuring at least one of the resistance, the dielectric constant, and the impedance of the surface to be chucked is arranged in the electrostatic chuck pad 13B of the reticle changer hand 13A; alternatively, a measuring unit may be arranged in other conveyance mechanisms within the exposure system, such as the reticle alignment hand 114A or the reticle stage 6. In any case, by measuring at least one of the resistance, the impedance, and the dielectric constant of the contact surface between the substrate and the conveying hand on the conveying path in advance, the conveying condition is calculated from the obtained measured values by the controller (not shown) corresponding to the measured values. Thereby, by controlling any one of the conveying velocity, the conveying acceleration, and the voltage supplied to the electrostatic chuck, or the combination of all the conditions, reliable conveyance can be achieved.

Also, the above-mentioned unit may be arranged in the reticle stocker 12 outside the conveyance mechanism or in the reticle holding mechanism outside the gate valve 20 in the atmospheric condition inside the exposure system. Also, in this case, by measuring the characteristics of the surface to be chucked in advance of the reticle conveyance, the reticle can be conveyed with an optimum conveying profile.

Furthermore, according to the embodiment, a unit for measuring at least one of the resistance, the dielectric constant, and the impedance of the surface to be chucked is arranged in the electrostatic chuck pad of the reticle changer hand; alternatively, a unit for measuring at least one of the resistance, the dielectric constant, and the impedance of the surface to be chucked can be arranged in the wafer chuck for holding the wafer when the wafer is exposed.

Second Embodiment

Figure 6:
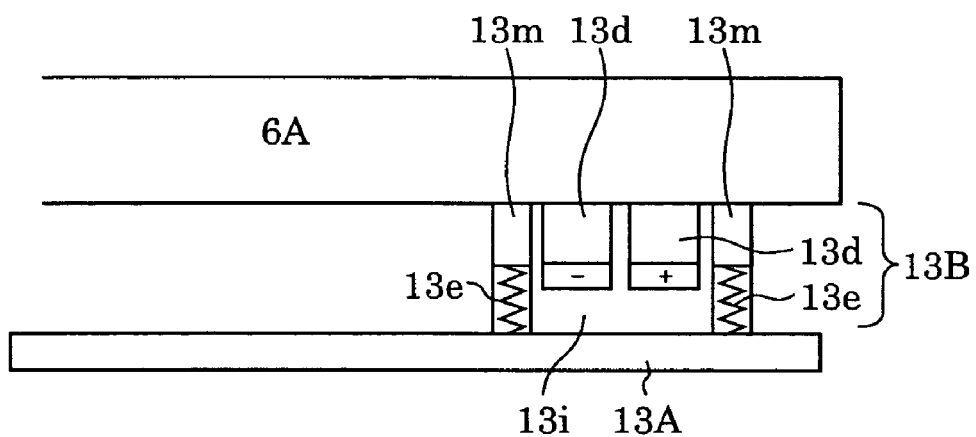
FIG. 6 is a schematic view of an electrostatic chuck pad 13B according to a second embodiment viewed laterally in one location.

FIG. 6 is a schematic view of the electrostatic chuck pad 13B according to a second embodiment viewed laterally in one location. According to the second embodiment, a measuring electrode 13m is connected to the surface to be chucked via an elastic body 13e. To the measuring electrode 13m, wiring (not shown) is connected. By connecting the measuring electrode 13m to the surface to be chucked via the elastic body 13e, even if the surface to be chucked or the contact surface of the electrostatic chuck pad 13B is wavy or otherwise not flat, the measuring electrode 13m can be securely connected to the contact surface of the reticle 6A. Thus, at least one of the resistance, the dielectric constant, and the impedance of the surface to be chucked can be precisely measured.

Third Embodiment

Figure 7:
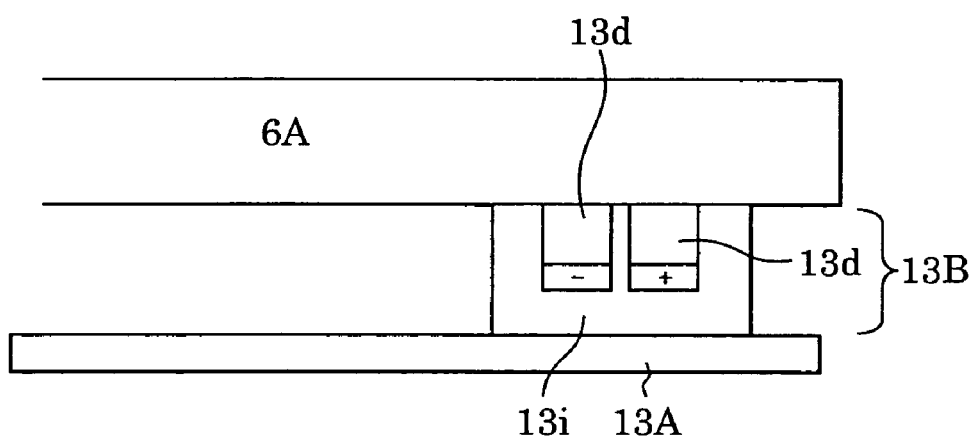
FIG. 7 is a schematic view of the electrostatic chuck pad 13B according to a third embodiment viewed laterally in one location.
Figure 8:
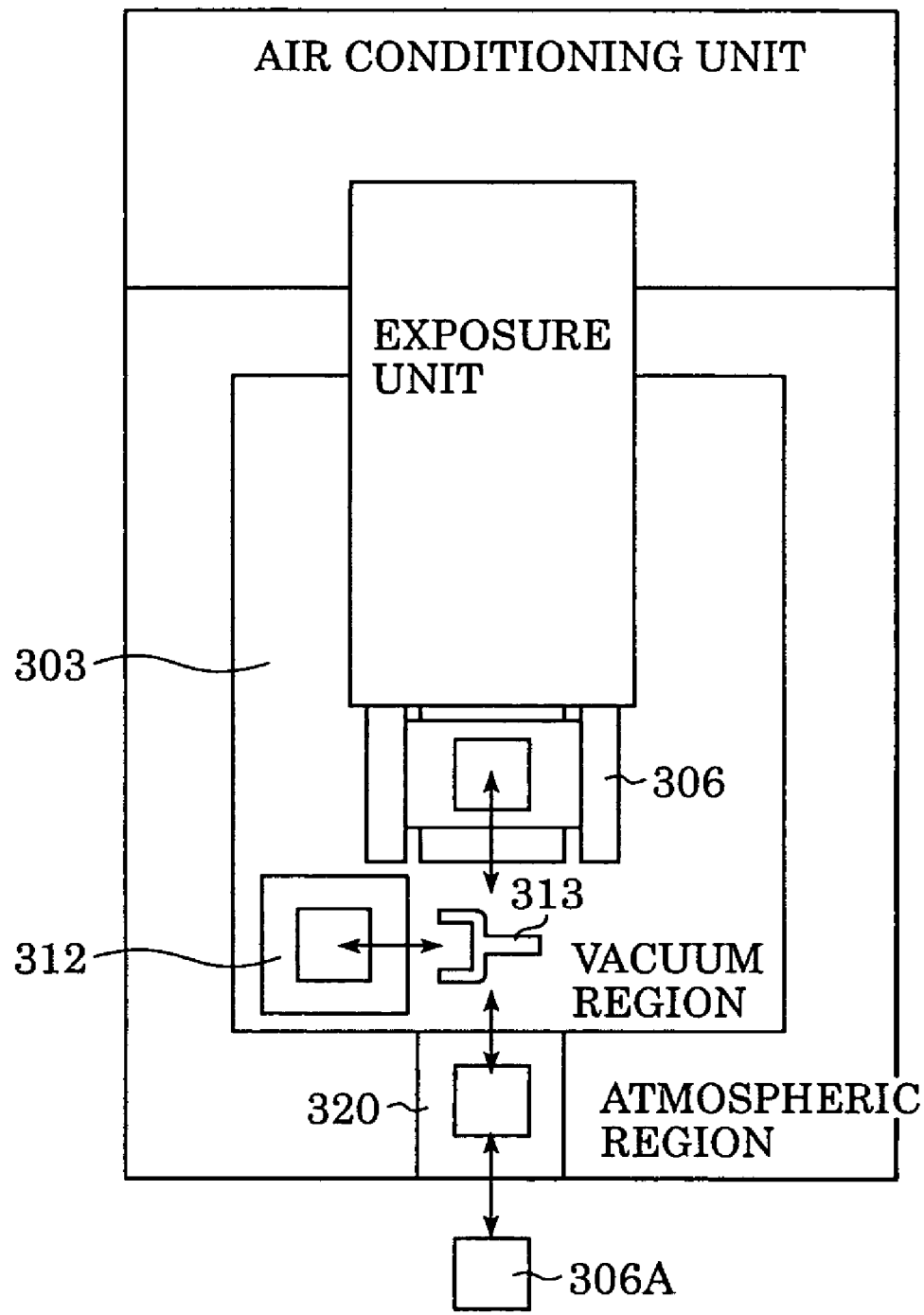
FIG. 8 is a structural drawing of a conventional EUV exposure apparatus.

FIG. 7 is a schematic view of the electrostatic chuck pad 13B according to a third embodiment viewed laterally in one location. The feature of the third embodiment is that the electrode of the electrostatic chuck pad 13B and the dielectric body 13d also serve as a measuring electrode for measuring the resistance, the dielectric constant, or the impedance of the surface to be chucked. Referring to FIG. 4B, since Cb and Rb denote the capacitance value and the resistance between the dielectric body 13d and the electrode, when measuring them in advance, Ca and Ra can be obtained by measuring the resistance, the dielectric constant, or the impedance of the entire that consists of Cb, Rb, Ca, and Ra. In the same way as in the first embodiment, in the relationship between the resistance, the dielectric constant, or the impedance of the surface to be chucked and the attraction force, the reticle peeling and the displacement of the reticle 6A due to a lateral force may be measured and stored in the controller as a table. According to the embodiment, since the position for measuring characteristics of the surface to be chucked precisely agrees with that of the attraction by the electrostatic chuck pad 13B, the effect of the peeling in the conductive film of the reticle 6A can be precisely measured, achieving more reliable conveyance.

Manufacturing Process

Figure 9:
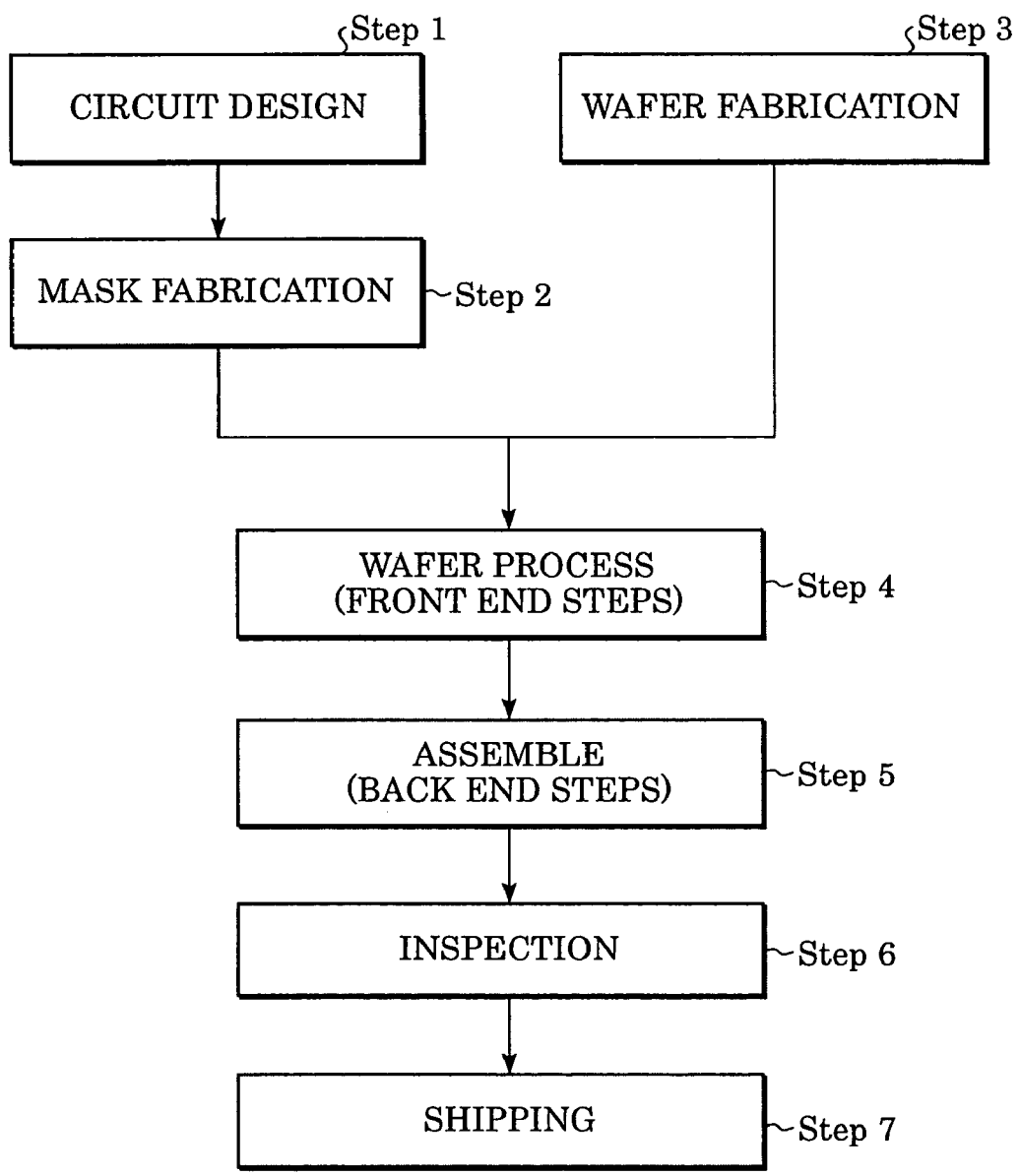
FIG. 9 is a flowchart of the entire manufacturing process of semiconductor devices.

A manufacturing process of semiconductor devices using the exposure system of the present invention will now be described. FIG. 9 is a flowchart of the entire manufacturing process of the semiconductor devices. At Step 1 (circuit design), the circuit of the semiconductor device is designed. At Step 2 (mask fabrication), a mask is fabricated based on the designed circuit pattern.

On the other hand, at Step 3 (wafer fabrication), a wafer is fabricated using a material such as silicon. At Step 4 (wafer process), which is referred to as the front-end steps, using the above-mentioned mask and wafer, the practical circuit is formed on the wafer by the lithographic technique in the exposure system. At Step 5 (assemble), which is referred to as the back-end steps, using the wafer fabricated at Step 4, a semiconductor chip is assembled including an assembly process (dicing and bonding) and a packaging process (chip inclusion). At Step 6 (inspection), the semiconductor device fabricated at Step 5 is inspected in an operation confirmation and durability test. The semiconductor device is completed through these steps so that at Step 7, it is shipped.

The wafer process at Step 4 includes: an oxidation step oxidizing the wafer surface; a CVD step depositing an insulating film on the wafer surface; an electrode forming step evaporating an electrode on the wafer; an ion implantation step implanting ions on the wafer; a resist process step applying a sensitizer on the wafer; an exposure step transferring a circuit pattern on the resist-processed wafer by the exposure apparatus; a developing step developing the wafer exposed at the exposing step; an etching step cutting off parts other than resist images developed at the developing step; and a resist peeling step removing the unnecessary resist after etching. By repeating these steps, multiple circuit patterns are formed on the wafer.

According to the embodiments, in the conveyance of a disc object by a conveying hand having an electrostatic chuck in the vacuum, highly reliable conveyance can be performed independently of the presence, the material, the thickness, and the quality of a conductive film of a surface to be chucked.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-175604, entitled "PLATE-LIKE OBJECT CONVEYING METHOD, CONVEYANCE DEVICE, AND EXPOSURE APPARATUS" and filed on Jun. 14, 2004, the entire contents of which are incorporated herein by reference.

What is claimed is:

1. A method of holding an object with an electrostatic chuck and conveying the held object, said method comprising steps of:
   measuring with a measuring electrode at least one of a resistance of the object, an impedance of the object, and a dielectric constant of the object, wherein the measuring electrode is different from an electrode for attracting the object, and wherein the measuring electrode is in contact with a held surface of the object; and
   controlling at least one of a velocity of conveyance of the object, an acceleration of conveyance of the object and a voltage applied to the electrostatic chuck based on a measurement result in said measuring step.

2. A method according to claim 1, wherein said measuring step measures the at least one of a velocity of conveyance of the object, an acceleration of conveyance of the object and a voltage applied to the electrostatic chuck with the object on the electrostatic chuck.

3. A conveyance apparatus for conveying an object, said apparatus comprising:
   an electrostatic chuck, with an electrode for attracting the object, to hold the object by applying a voltage to the electrode for attracting the object;
   a supporting member to support said electrostatic chuck;
   a measuring system to measure with a measuring electrode at least one of a resistance of the object, an impedance of the object, and a dielectric constant of the object, wherein the measuring electrode is different from the electrode for attracting the object, and wherein the measuring electrode is in contact with a held surface of the object; and
   a control system to control at least one of a velocity of conveyance of the object, an acceleration of conveyance of the object and a voltage applied to said electrostatic chuck based on a measurement result by said measuring system.

4. An apparatus according to claim 3, wherein said measuring electrode is supported by said supporting member.

5. An apparatus according to claim 4, further comprising an elastic member arranged between said measuring electrode and said supporting member.

6. An exposure apparatus for transferring a pattern of an original to a substrate, said apparatus comprising:
   a conveyance apparatus, as defined in claim 3, to convey at least one of the original and the substrate.

7. A method of manufacturing a device, said method comprising steps of:
   transferring a pattern of an original to a substrate using an exposure apparatus as defined in claim 6;
   developing the substrate to which the pattern has been transferred; and
   processing the developed substrate to manufacture the device.

8. A conveyance apparatus for conveying an object, said apparatus comprising:
   electrostatic chucking means, with an electrode for attracting the object, for holding the object by applying a voltage to the electrode for attracting the object;
   supporting means for supporting said electrostatic chucking means;
   measuring means for measuring at least one of a resistance of the object, an impedance of the object, and a dielectric constant of the object, with a measuring electrode, wherein the measuring electrode is different from the electrode for attracting the object, and wherein the measuring electrode is in contact with a held surface of the object; and
   control means for controlling a velocity of conveyance of the object, an acceleration of conveyance of the object and a voltage applied to said electrostatic chucking means based on a measurement result by said measuring means.

9. An apparatus according to claim 8, wherein said measuring means comprises a measuring electrode supported by said supporting means.

10. An apparatus according to claim 9, further comprising elastic means arranged between said measuring electrode and said supporting means.

11. An exposure apparatus for transferring a pattern of an original to a substrate, said apparatus comprising:
   a conveyance apparatus, as defined in claim 8, to convey at least one of the original and the substrate.

12. A method of manufacturing a device, said method comprising steps of:
- transferring a pattern of an original to a substrate using an exposure apparatus as defined in claim 11;
- developing the substrate to which the pattern has been transferred; and
- processing the developed substrate to manufacture the device.

13. A method of holding an object with a hand that includes an electrostatic chuck, and conveying the held object, said method comprising steps of:
- measuring with a measuring electrode at least one of a resistance of the object, an impedance of the object, and a dielectric constant of the object, wherein the measuring electrode is different from an electrode for attracting the object, and wherein the measuring electrode is in contact with a held surface of the object; and
- controlling at a time of conveyance at least one of a velocity of conveyance of the object, an acceleration of conveyance of the object and a voltage applied to the electrostatic chuck based on a measurement result in said measuring step,
- wherein said measuring occurs prior to conveyance of the object, and
- wherein said controlling occurs during conveyance of the object.

14. A conveyance apparatus for conveying an object, said apparatus comprising:
- a hand to hold the object by applying a voltage to an electrode for attracting the object, wherein said hand includes an electrostatic chuck having the electrode;
- a supporting member to support the electrostatic chuck;
- a measuring system to measure, prior to conveyance of the object, at least one of a resistance of the object, an impedance of the object, and a dielectric constant of the object, wherein said measuring system includes a measuring electrode different from the electrode for attracting the object, and wherein the measuring electrode is in contact with a held surface of the object;
- a control system to control, during conveyance of the object, at least one of a velocity of conveyance of the object, an acceleration of conveyance of the object and a voltage applied to said electrostatic chuck based on a measurement result by said measuring system.

15. A conveyance apparatus for conveying an object, the apparatus comprising:
- electrostatic chucking means for holding the object by applying a voltage to an electrode for attracting the object, said electrostatic chucking means including the electrode;
- supporting means for supporting said electrostatic chucking means;
- measuring means for measuring, prior to conveyance of the object, at least one of a resistance of the object, an impedance of the object, and a dielectric constant of the object with a measuring electrode, wherein the measuring electrode is different from the electrode for attracting the object, and wherein the measuring electrode is in contact with a held surface of the object; and
- control means for controlling, during conveyance of the object, a velocity of conveyance of the object, an acceleration of conveyance of the object and a voltage applied to said electrostatic chucking means based on a measurement result by said measuring means.

* * * * *